United States Patent
Hermann

(10) Patent No.: US 11,808,809 B2
(45) Date of Patent: Nov. 7, 2023

(54) ELECTRICAL CIRCUIT FOR TESTING PRIMARY INTERNAL SIGNALS OF AN ASIC

(71) Applicant: Robert Bosch GmbH, Stuttgart (DE)

(72) Inventor: Carsten Hermann, Dusslingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 774 days.

(21) Appl. No.: 16/961,229

(22) PCT Filed: Nov. 23, 2018

(86) PCT No.: PCT/EP2018/082345
§ 371 (c)(1),
(2) Date: Sep. 3, 2020

(87) PCT Pub. No.: WO2019/141417
PCT Pub. Date: Jul. 25, 2019

(65) Prior Publication Data
US 2021/0063483 A1    Mar. 4, 2021

(30) Foreign Application Priority Data

Jan. 17, 2018 (DE) ...................... 10 2018 200 723.3

(51) Int. Cl.
*G01R 31/3167* (2006.01)
*G01R 31/317* (2006.01)

(52) U.S. Cl.
CPC ..... *G01R 31/3167* (2013.01); *G01R 31/3172* (2013.01); *G01R 31/31701* (2013.01); *G01R 31/31703* (2013.01)

(58) Field of Classification Search
CPC .......... G01R 31/3167; G01R 31/31701; G01R 31/31703; G01R 31/3172
(Continued)

(56) References Cited

U.S. PATENT DOCUMENTS 5,570,090 A   10/1996  Cummins
10,571,518 B1* 2/2020  Waayers .......... G01R 31/31701
(Continued)

FOREIGN PATENT DOCUMENTS

DE    3490343 C2   10/1985
DE    10314616 B3   7/2004
(Continued)

OTHER PUBLICATIONS

International Search Report dated Feb. 26, 2019 in connection with International Application No. PCT/EP2018/082345.

*Primary Examiner* — Giovanni Astacio-Oquendo
(74) *Attorney, Agent, or Firm* — NORTON ROSE FULBRIGHT US LLP; Gerard Messina

(57) ABSTRACT

An electrical circuit for testing primary internal signals of an ASIC. Only test pin is provided via which a selection can be made of a digital or analog signal to be observed. The electrical circuit includes a Schmitt trigger between the test pin and an output terminal of the electrical circuit. A test mode id activated when a switching threshold of the Schmitt trigger is exceeded. At least one sub-circuit is provided for the observation of a digital signal, having a resistor, an NMOS transistor, and an AND gate, at whose first input the digital signal is present. The resistor is between the test pin and the drain terminal of the NMOS transistor. The source terminal is connected to ground, and the gate terminal is connected to the output of the AND gate. The second input of the AND gate being connected to the output terminal of the electrical circuit.

17 Claims, 5 Drawing Sheets

(58) Field of Classification Search
USPC .......................................... 324/500, 515, 525
See application file for complete search history.

(56) References Cited

U.S. PATENT DOCUMENTS

| | | |
|---|---|---|
| 11,585,849 B2* | 2/2023 | Chen .................... H03M 1/66 |
| 2003/0006811 A1 | 1/2003 | Oosawa et al. |
| 2014/0063348 A1 | 3/2014 | Verlinden |
| 2017/0077003 A1 | 3/2017 | Vanhooren et al. |
| 2019/0178938 A1* | 6/2019 | Jin .................... G01R 31/3167 |

FOREIGN PATENT DOCUMENTS

| | | |
|---|---|---|
| EP | 239929 A2 | 10/1987 |
| GB | 2157905 A | 10/1985 |

* cited by examiner

Fig. 3 ( part1 )
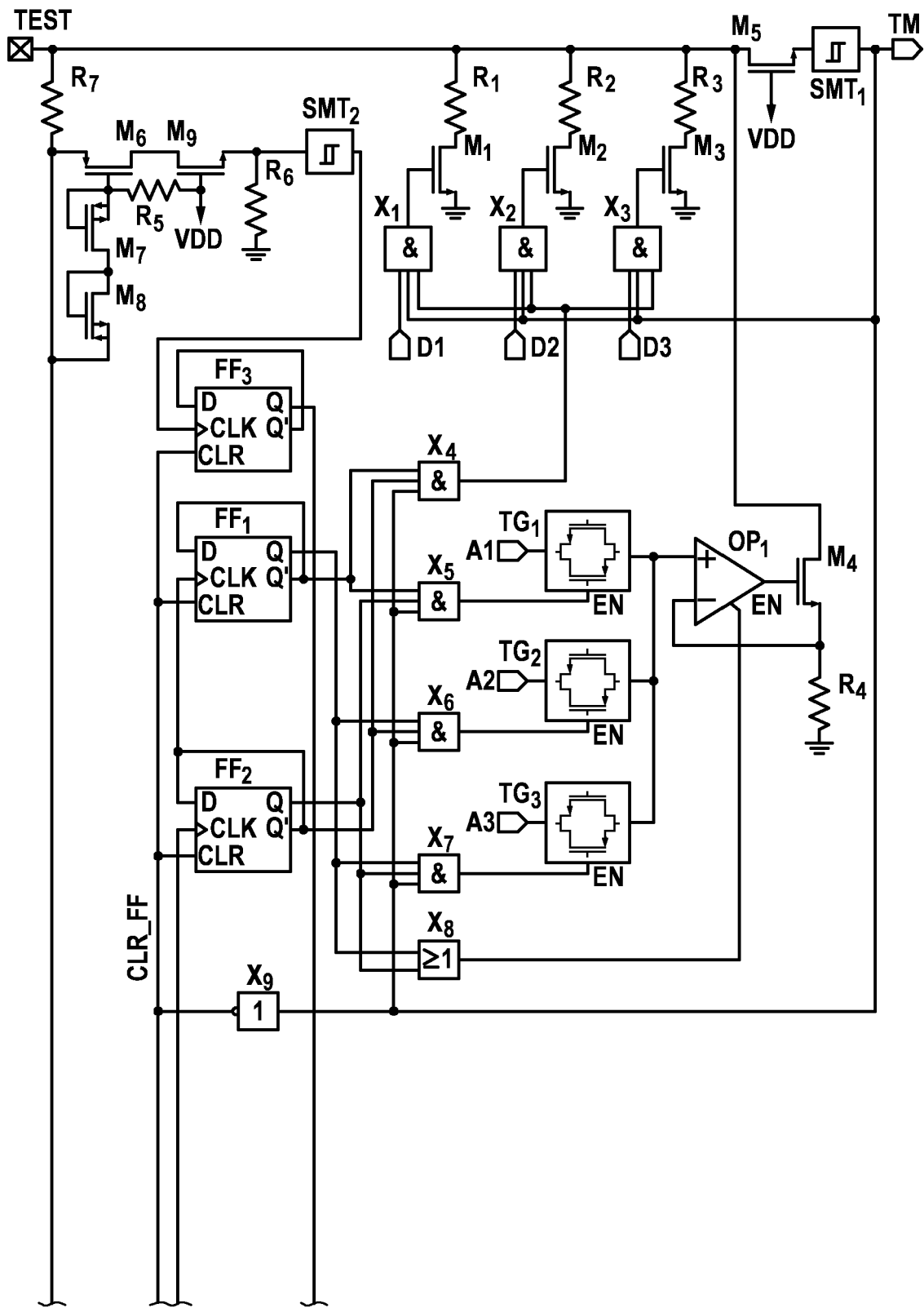

Fig. 3 ( part2 )
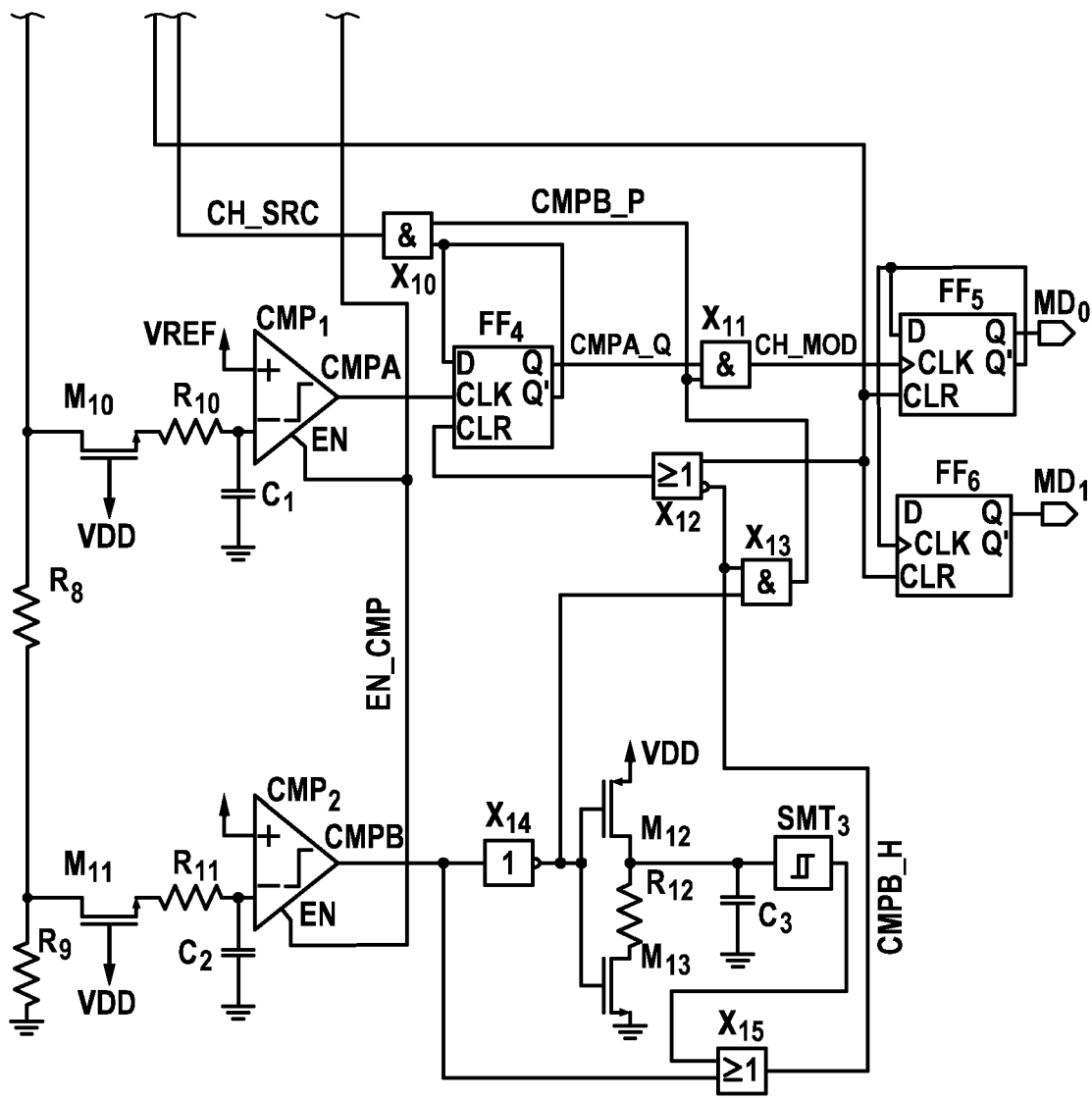

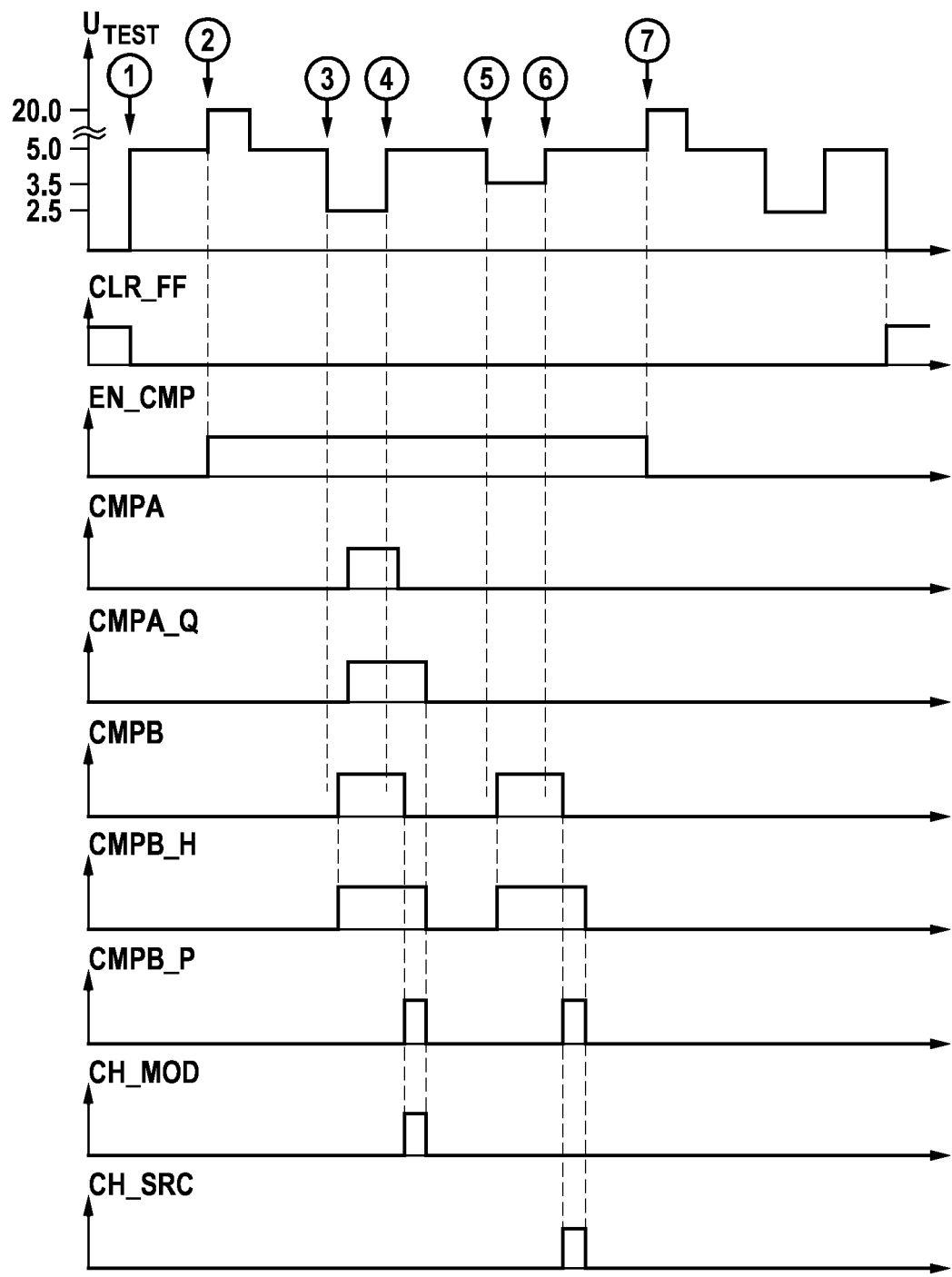

ELECTRICAL CIRCUIT FOR TESTING PRIMARY INTERNAL SIGNALS OF AN ASIC

FIELD

The present invention relates to an electrical circuit for testing primary internal signals of an ASIC, only one test pin being provided via which a selection can be made of one or more digital signals to be observed, or a selection of an analog signal can be made.

BACKGROUND INFORMATION

Application-specific integrated circuits (ASIC) are tested during their manufacturing process and before delivery. For this purpose, internal digital and/or analog signals must be capable of being provided in observable or measurable fashion via a test interface. For this purpose, in general the ASIC is put into a testing mode in which the digital and/or analog signals can be connected to one or more separate terminals of the ASIC via a multiplexer. The selection of the signals, which are usually to be tested one after the other, can take place for example via the serial peripheral interface (SPI), or using an interface according to the IEEE standard 1149.1 (also known as the Joint Test Action Group, or JTAG). Up to now, this has required that essential parts of the ASIC infrastructure, such as the internal voltage supply, the voltage reference, the communication interface, and the digital part of the ASIC, or at least regions of the digital part of the ASIC, as well as parts of the analog part, be in operation.

In this way, the testability—in particular that of the primary internal test variables, such as f the primary voltage supply, the primary voltage reference, and the reset signals of the primary voltage supply—of an ASIC can be limited.

If primary internal signals of an ASIC are to be capable of being conducted to the outside via the test interface, a careful and therefore complex design is required in order to ensure that the normal operation of the ASIC, in particular its startup, is not endangered by the testability of the corresponding signals. If, for example, the reset signal of the primary internal supply voltage is to be capable of being tested, then the effect of this reset signal in test operation has to be capable of being suppressed, or masked, during it. A suppression during normal operation would however impair the normal functioning of the ASIC. It therefore has to be ensured that such signals are not impaired during normal operation.

If, in addition, internal analog voltages, such as the primary internal reference voltage, are to be conducted to the outside via a decentral analog multiplexer, it has to be ensured that these signals cannot be impaired during normal operation. Transmission gates of a distributed multiplexer that are wrongly controlled during startup could for example short-circuit the primary internal reference voltage with another signal to be tested and in this way could prevent the startup, even if the incorrect controlling takes place only for a short time.

For example, in some circumstances, it also may not be possible to observe a reset signal of an internal primary supply voltage or a power-on-reset signal via the test interface if the internal primary voltage has to be so small, for testing purposes, that the supply voltage derived from this internal primary voltage supply is not adequate to operate the digital part.

SUMMARY

According to the present invention, an electrical circuit is provided for testing primary internal signals of an ASIC, only one test pin being provided via which a selection can be carried out of one or more digital signals to be observed, or of an analog signal.

Through acquisition by measurement, enabled in this way, of the current flowing into the test pin terminal, the state of the signal to be observed, or of the signals to be observed, can be inferred. Such a signal is particularly suitable for testing the above-named primary test variables, such as the primary supply voltage, the primary reference voltage, and the reset signals of the primary voltage supply of an ASIC.

Here, according to an example embodiment of the present invention, a Schmitt trigger situated between the test pin and an output terminal of the electrical circuit is provided, a test mode being activated when a switching threshold of the Schmitt trigger is exceeded. In addition, the electrical circuit according to the present invention includes at least one sub-circuit, provided for the observation of a digital signal, having a resistor, an NMOS transistor, and an AND gate at whose first input the digital signal is provided. Here, the resistor is situated between the test pin and the drain terminal of the NMOS transistor, the source terminal of the NMOS transistor is connected to ground, the gate terminal of the NMOS transistor is connected to the output of the AND gate, and the second input of the AND gate is connected to the output terminal of the electrical circuit.

Depending on the corresponding specific realization, the example circuit according to the present invention is suitable for testing any desired internal digital signal, and, corresponding to a preferred specific embodiment, any desired internal analog signal, of an ASIC.

In the example circuit, it is particularly advantageous that the ASIC infrastructure has to be ready for operation only to the extent that, during the test of a digital or analog signal, only one internal voltage supply is available. Besides this voltage supply, and the circuits proposed corresponding to the exemplary embodiments, no further circuit parts of the ASIC need be ready for operation.

In particular, the digital part of the ASIC does not have to be functionally ready, but rather can be in reset. A communication interface operated by the digital part of the ASIC is also not required.

Compared to the conventional solutions, according to the example embodiment of the present invention, the communication for possible changeover to a particular test mode, the communication for selecting one of the digital or analog signals to be observed, and the acquisition by measurement of these signals, take place via a single terminal of the ASIC.

In this way, it is enabled that the primary test variables, or any other desired digital or analog signals, are as it were tested or observed in their normal functioning, i.e., in normal operation. For example, the masking of reset signals is therefore not required. Correspondingly, the design of an ASIC for representing its actual function can be simplified.

According to the example embodiment of the present invention, the test pin can be understood as a bidirectional interface, because via this pin, through the application of voltages having different magnitudes in a suitable temporal sequence an item of information, in particular concerning exactly what is to be acquired by measurement, or concerning which test mode is to be activated, can be transmitted into the ASIC. In addition, the test pin can however also provide information about internal signals in the form of a current that flows into it.

Each internal digital signal modifies the current, in the present case weighted corresponding to the equation $I_{TEST}=U_{TEST}/R \times[1/2^0+1/(D_1\times 2^1)+1/(D_2\times 2^2)+ \ldots +1/(D_n\times 2^n)]$. If all the digital signals are LOW, then only the current $I_{TEST}=U_{TEST}/R\times1/2^0$ flows into the test pin. If for example the internal digital signal $D_1$=HIGH, then in addition the current $I_{TEST}=U_{TEST}/R\times1/2^1$ flows into the test pin. Analogously, given an internal digital signal $D_2$=HIGH, the current $I_{TEST}=U_{TEST}/R\times1/2^2$ additionally flows into the test pin. The currents are weighted and are superposed. In this way, through acquisition by measurement of the current, the states of all internal digital signals can be inferred simultaneously, or in parallel. Accordingly, the weighting of the currents is essential for a simultaneous or parallel acquisition of the internal digital signals, so that a corresponding weighting of the resistances used for a function of the circuit is to be considered.

If instead of all internal digital signals $D, \ldots, D_n$, one of the analog signals $A_1, \ldots, A_m$ is selected, then its internal voltage value can be inferred by measuring the current flowing into the test pin. This results as $I_{TEST}=U_{TEST}/R+U_A/R$, where $U_A$ is the voltage value of the one selected internal analog signal $A_1, \ldots, A_m$.

The selection of what can be acquired by measurement at the test pin, namely either all digital signals $D_1, D_2, \ldots, D_n$ simultaneously via weighted currents or one of the analog signals $A_1, A_2, \ldots, A_m$ via a current proportional to the voltage of the signal, as well as the selection of a test mode, takes place via a protocol that is also transmitted into the ASIC via the test pin of the ASIC. This is done in that the information concerning what is to be acquired by measurement, or which test mode is to be activated, is detected from the voltage levels, which have different magnitudes, at the test pin using a voltage divider and using Schmitt triggers and comparators, and is evaluated by a logic unit.

In a particular specific embodiment, it is provided according to the present invention that the electrical circuit additionally includes a resistor situated between the test pin and ground, whose value can be ascertained by measuring the current flowing into the test pin as long as the voltage at the test pin is below the switching threshold of the Schmitt trigger. With the knowledge of this value and the measurement of the current flowing into the test pin, it is subsequently possible to infer the states of internal digital and analog signals.

According to a further specific embodiment in accordance with the present invention, the electrical circuit is further designed to observe analog signals, and includes an operational amplifier, a circuit having a Schmitt trigger for limiting the input voltage at the test pin, and at least one sub-circuit provided for observing the analog signal. In this way, in addition a test of analog signals for the circuit according to the present invention for testing an ASIC can be enabled.

According to a preferred embodiment of the present invention, the sub-circuit provided for observing the analog signal includes a counter that has two D flipflops, and has, for each analog signal to be observed, a decoder that has an AND gate, as well as a transmission gate. In this way, it is enabled that, depending on the counter state (00, 01, 10, or 11) of the D flipflop, one of the AND gates has a HIGH level at its output, so that the EN input of the corresponding transmission gate is controlled such that it produces a low-ohmic connection between its two other terminals. Preferably, the counter can also be made up of more than two D flipflops. Correspondingly, $m=2^d-1$ analog signals $A_1, \ldots, A_m$, can then be observed, where d is the number of D flipflops. As a decoder, a classical 1-of-m decoder, of a generally known design, is provided, also referred to in the existing art as a 1-of-n decoder, made up of $2^d$ AND gates each having d inputs, the AND gate whose inputs are all connected to the inverted outputs Q' of the D flipflop being provided for selecting the observation of all digital signals simultaneously.

Preferably, a first input of the respective AND gate is connected to the non-inverted output, or to the inverted output, of a first of the D flipflops, a second input of the respective AND gate is connected to the non-inverted, or to the inverted, output of a second of the D flipflops, and the output of the respective AND gate is connected to an input for controlling the respective transmission gate. In this way, it is achieved that the D flipflops that are used can assume the counter states 00, 01, 10, and 11, so that in this way different internal analog signals are selectable for the observation.

According to a preferred embodiment of the electrical circuit of the present invention, in addition an OR gate is provided whose first input is connected to the non-inverted output of the first of the at least two D flipflops, whose second input is connected to the non-inverted output of the second of the at least two D flipflops, and whose output is connected to an input for controlling the operational amplifier. The advantage of such an embodiment is that, based on the signals outputted by the D flipflops, a controlling of the operational amplifier can take place, and in this way the current flowing into the test pin of the electrical circuit is influenced by the respectively selected internal analog signal.

In a further advantageous embodiment of the present invention, for the electrical circuit according to the present invention in addition an AND gate is provided whose first input is connected to the inverted output of the first of the at least two D flipflops, whose second input is connected to the inverted output of the second of the at least two D flipflops, and whose output is connected to a respective third input of the at least one AND gate situated in the sub-circuit provided for the observation of a digital signal. In this way, it can be achieved that the outputs of the AND gates used for the observation of a digital signal can be set to LOW, so that none of the digital signals can influence the current flowing into the test pin of the ASIC. In this way, only an observation of analog signals can take place.

Advantageously, in the circuit for limiting the input voltage at the test pin its input is situated between two resistors of a voltage divider situated between the test pin of the electrical circuit and ground, and its output is connected to the clock signal input of a D flipflop.

In a preferred embodiment of the present invention, the output terminal of the electrical circuit is inverted by an inverter and is respectively connected to a clear input of a D flipflop. In this way, the counter state of the D flipflop can be reset, because, using the HIGH level of the inverter, the D flipflops can be reset via clear inputs.

Particularly preferably, the electrical circuit additionally includes two comparators for selecting the digital or analog signals to be measured via the test pin, and for activating different test modes. Such an embodiment is advantageous in particular because an electrical circuit realized in this way enables different test modes, or test methods, and can in addition easily be expanded to include operation with a plurality of terminals via which signals can be selected and observed in the same way.

Here, a reference voltage is advantageously present at the positive input of each of the comparators, and the negative input of each of the comparators is connected to the test pin. There exists the possibility of deactivating the comparators, and therefore of testing the internal digital and/or analog signals, even when the operating voltage or reference voltage have not assumed their target values, so that for example it can be acquired by measurement from which internal supply voltage the internal reference voltage reaches its target value, or an internal power-on-reset signal changes its state.

In accordance with an example embodiment of the present invention, preferably, a circuit, made up of a transistor and a resistor and capacitor, is provided between the negative input of each of the comparators and the test pin of the electrical circuit. This enables a protection of the comparator inputs from excessively high voltages at their inputs, and enables a filtering and delaying of the input signals.

According to a further preferred embodiment of the present invention, in the electrical circuit a D flipflop is additionally provided whose clock signal input is connected to the output of the Schmitt trigger and whose non-inverted output is respectively connected to an input for controlling the respective comparator.

Alternatively, it is advantageously provided that the electrical circuit includes two D flipflops that are provided in order to provide output signals. An outputting of such signals is advantageous because these can be used in the ASIC to create particular test conditions.

Alternatively, a shift register made up of D flipflops can be provided for selecting the signals to be tested and for setting a test mode.

Advantageous developments of the present invention are described herein and are shown in the figures.

BRIEF DESCRIPTION OF THE DRAWINGS

Exemplary embodiments of the present invention are explained in more detail on the basis of the figures and the description below.

FIG. 3 shows an exemplary embodiment of an electrical circuit for testing digital and analog signals, with the possibility of activating different testing modes in accordance with the present invention.

FIG. 4 shows a signal curve of the above-named exemplary embodiment of an electrical circuit for testing digital and analog signals, with the possibility for activating different test modes, according to FIG. 3, in accordance with the present invention.

DETAILED DESCRIPTION OF EXAMPLE EMBODIMENTS

In the description herein of the exemplary embodiments of the present invention, the voltages related to ground GND at terminals or networks are designated, for example, $U_{TEST}$ for the terminal TEST, or $U_{VDD}$ for the network VDD. In contrast, currents that flow into terminals are designated for example $I_{TEST}$ for the ASIC terminal TEST.

Figure 1:
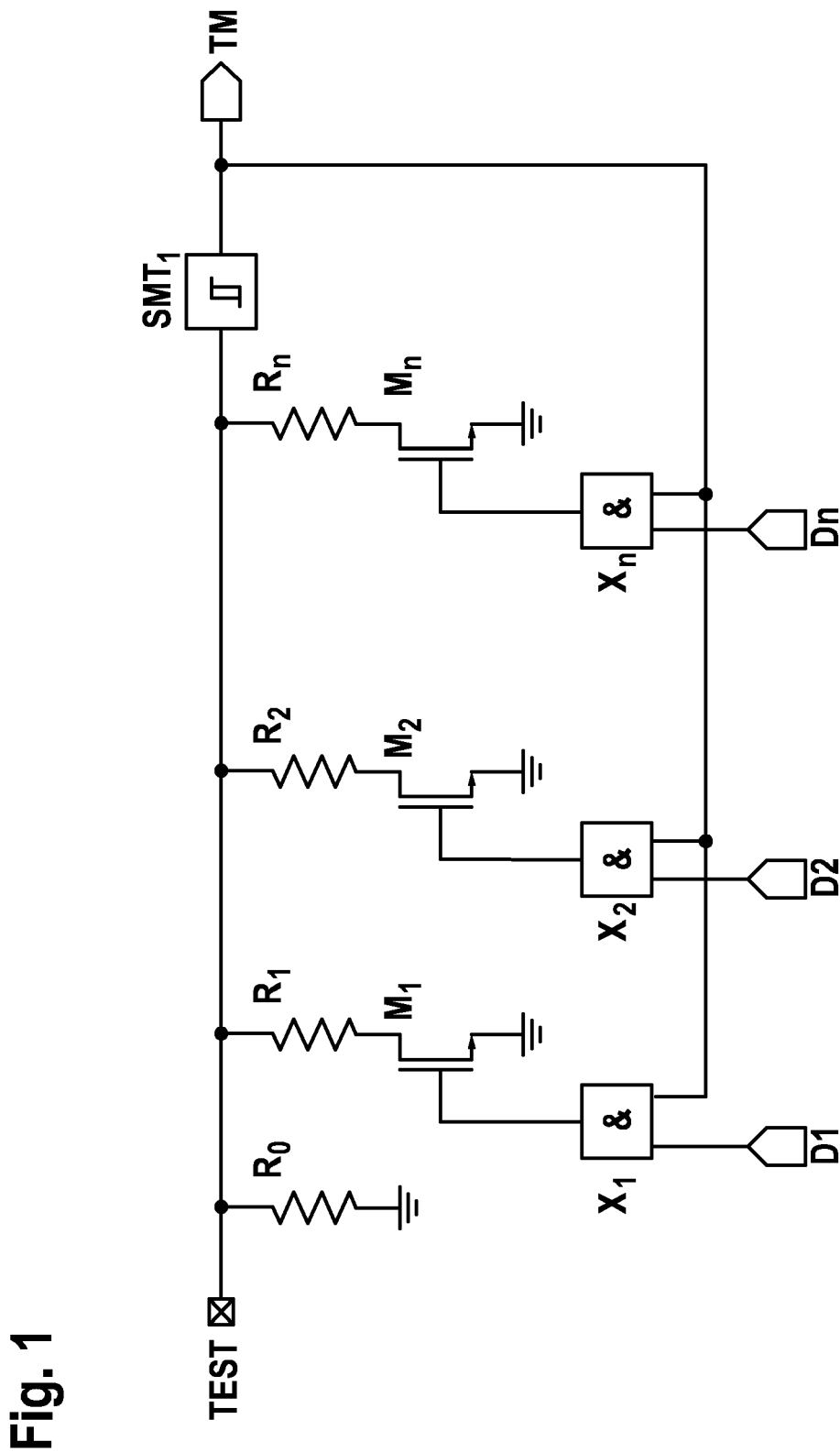
FIG. 1 shows an exemplary embodiment of an electrical circuit for testing digital signals in accordance with the present invention.

FIG. 1 shows an exemplary embodiment of an electrical circuit for testing digital signals that, according to a first circuit-based realization, is suitable only for testing internal digital signals. Via the ASIC terminal TEST, a change to the test mode can be made when a voltage is applied that is greater than the switching threshold of Schmitt trigger $SMT_1$. This is indicated by a high level at output terminal TM of the circuit that is connected to the output of Schmitt trigger $SMT_1$. Schmitt trigger $SMT_1$ and the AND gates $X_1$ through $X_n$ are supplied with a supply voltage $U_{VDD}$ (not shown in FIG. 1). The switching thresholds of the Schmitt trigger are typically at ⅔ or ⅓ of the supply voltage $U_{VDD}$.

If the voltage $U_{TEST}$ at the ASIC terminal TEST is increased from 0V up to the operating voltage of $U_{VDD}$, then the output of Schmitt trigger $SMT_1$ remains at a low level LOW until its input voltage, or the voltage $U_{TEST}$ at ASIC terminal TEST, is above the switching threshold of, typically, ⅔×$U_{VDD}$. During this time, it is possible to determine the value of the resistor $R_0=2^0 \times R$ using Ohm's law, by determining the current $I_{TEST}$ that flows in ASIC terminal TEST at the voltage $U_{TEST}$ applied to this terminal. The resistance results as $R_0=R=U_{TEST}/I_{TEST}$.

As soon as the signal at the output terminal TM=HIGH, the internal digital signals $D_1$ through $D_n$ of the ASIC determine the additional current that flows into ASIC terminal TEST, in that transistors $M_1$ through $M_n$ connect resistors $R_1$ through $R_n$ to ground GND. If the values of the resistances $R_1$ through $R_n$ increase as in FIG. 1, for example, with $R_1=2^1 \times R$, $R_2=2^2 \times R$, ... $R_n=2_n \times R$, then by measuring the overall current that flows into the ASIC terminal TEST, and taking into account $R_0=R$, it can be ascertained which of the internal digital signals $D_1$ through $D_n$ has a HIGH or LOW level, because during TM=HIGH, the following holds for the current $I_{TEST}$ measurable at ASIC terminal TEST: $I_{TEST}=U_{TEST}R \times [1/2^0+1/(D_1 \times 2^1)+1/(D_2 \times 2^2)+ \ldots +1/(D_n \times 2n)]$, where in this equation, for $D_1 \ldots D_n$ a 1 or a 0 is to be used for a logical HIGH or LOW level respectively. Because the variables $U_{TEST}$ and R are known, in this way the states of the digital signals $D_1$ through $D_n$ can be determined via the measured current $I_{TEST}$.

If the voltage at the ASIC terminal TEST is reduced from $U_{VDD}$ to 0 V, then the output of Schmitt trigger $SMT_1$ remains at a HIGH level until its input voltage, or the voltage at ASIC terminal TEST, is below the switching threshold of, typically, ⅓×$U_{VDD}$. TM is then=LOW, and the internal digital signals $D_1$ through $D_n$ no longer have any influence on the overall current flowing into ASIC terminal TEST.

Figure 2:
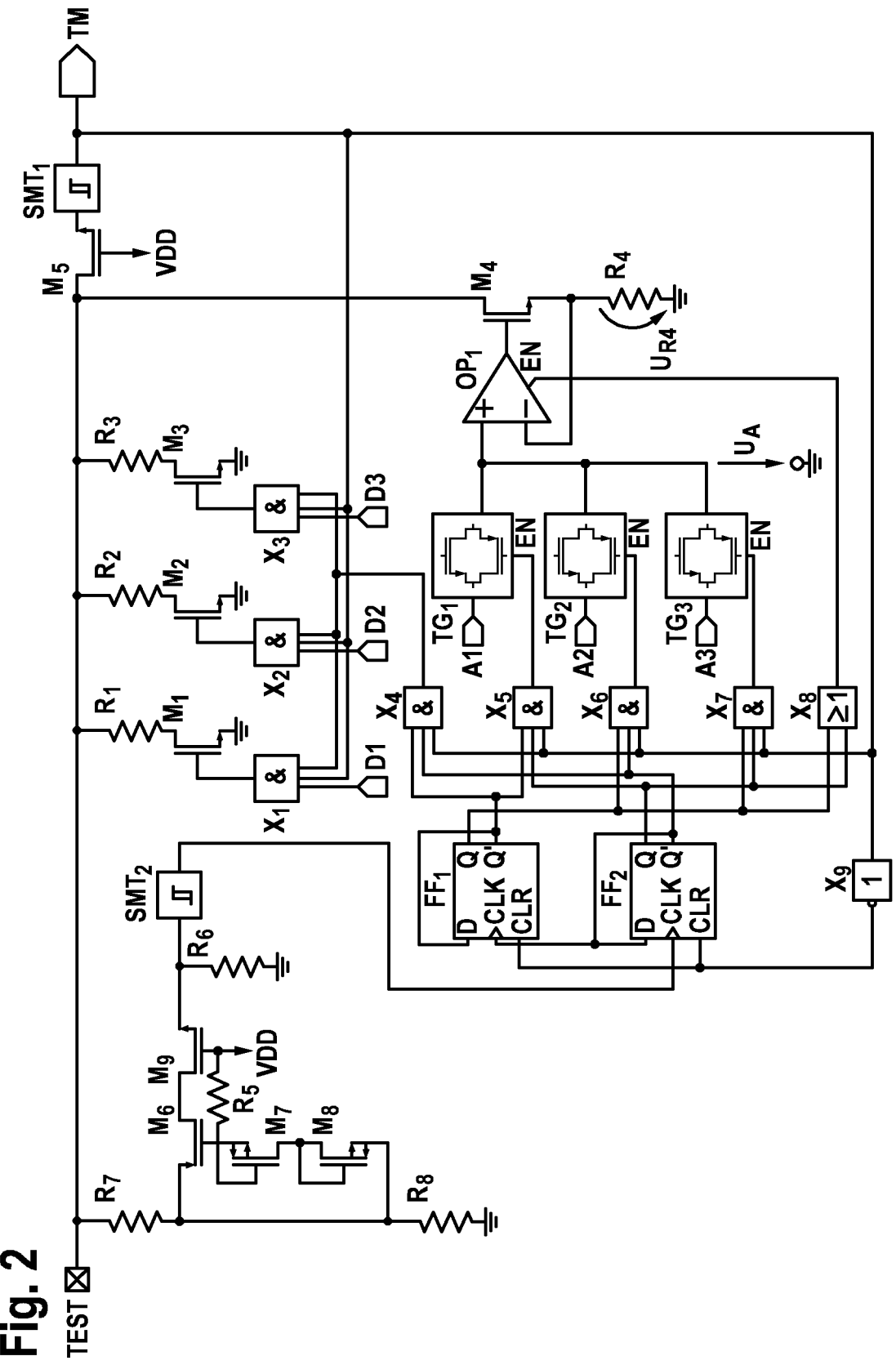
FIG. 2 shows an exemplary embodiment of an electrical circuit for testing digital and analog signals in accordance with the present invention.

FIG. 2 shows an exemplary embodiment of an electrical circuit for testing digital and analog signals, in which the circuit shown in FIG. 1 has been expanded to include testability of internal analog voltage signals, this being shown in FIG. 2 as an example for three digital signals $D_1$ through $D_3$ and three analog signals $A_1$ through $A_3$. The current flowing into ASIC terminal TEST can now be influenced by the voltage $UA_1$ through $UA_3$ of one of the analog signals $A_1$ through $A_3$, in that one of these signals is conducted via one of the transmission gates $TG_1$ through $TG_3$ to the positive input of operational amplifier $OP_1$, which, with the aid of transistor $M_4$, is operating as an impedance converter. Here, operational amplifier $OP_1$ controls the gate of transistor $M_4$ in such a way that the input difference voltage between its positive and its negative input is 0 V. The voltage $U_A$ at the positive input of operational amplifier $OP_1$ thus corresponds to the voltage drop $UR_4$ across the resistor $R_4=R$. Correspondingly, through resistor $R_4$ there flows a current $IR_4=U_A/R$ that is proportional to the voltage $U_{A1}$ through $U_{A3}$ of the selected analog voltage signal $A_1$ through $A_3$.

Which of the internal analog signals $A_1$ through $A_3$ is acquired by measurement at the ASIC terminal TEST is determined by the counter, made up of the D flipflops made up of $FF_1$ and $FF_2$, and by the decoder made up of AND gates $X_5$ through $X_7$. Depending on the counter state (01, 10, or 11), one of the AND gates has a HIGH level at its output, and thus controls the EN (enable) input of the corresponding transmission gate $TG_1$ through $TG_3$ so that this gate produces a low-ohmic connection between its two other terminals. The transmission gates whose EN input are at a LOW level are correspondingly high-ohmic.

If the counter state is not 00, then the output of OR gate $X_8$ is HIGH, and operational amplifier $OP_1$ operates in the manner described previously. Simultaneously, the output of AND gate $X_4$, and thus also the outputs of AND gates $X_1$ through $X_3$, are switched to LOW, so that none of the digital signals $D_1$ through $D_3$ can influence the current flowing into ASIC terminal TEST. The current flowing into ASIC terminal TEST results as $I_{TEST}=U_{TEST}/R+U_A/R$, where $U_A$ corresponds to a voltage $U_{A1}$ through $U_{A3}$, corresponding to the counter state. Because the variables $U_{TEST}$ and R are known, in this way the voltage of the selected internal analog signal can be determined via the measured current $I_{TEST}$.

If, in contrast, the counter state is 00, then the output of OR gate $X_8$ is LOW, and operational amplifier $OP_1$ is deactivated. The output of operational amplifier $OP_1$ used here is then at 0 V. Alternatively or in addition, the positive input of operational amplifier $OP_1$ could be connected by a transistor to ground GND (not shown in FIG. 2). At counter state 00, the output of AND gate $X_4$ is also at HIGH, so that digital signals $D_1$ through $D_3$ can influence the current flowing into ASIC terminal TEST, as described for FIG. 1.

The counter state is incremented upward with each rising edge of the output signal of Schmitt trigger $SMT_2$. When counter state 11 has been reached, then it is set back to 00 with the next rising edge at the CLK input of D flipflop $FF_2$. When TM=LOW it is also set to 00, because the HIGH level of inverter $X_9$ resets the D flipflops $FF_1$ and $FF_2$ via their CLR (clear) inputs (the outputs Q of the D flipflops are then LOW).

The output of Schmitt trigger $SMT_2$ changes from LOW to HIGH when its input voltage increases above the switching threshold of, typically, $2/3 \times U_{VDD}$. It changes from HIGH to LOW when its input voltage decreases below the switching threshold of, typically, $1/3 \times U_{VDD}$. The input of Schmitt trigger $SMT_2$ is connected to the ASIC test pin TEST via the transistors $M_6$ and $M_9$, as well as the voltage divider formed from $R_7$ and $R_8$, where $R_7=R_8=R/2$. So that the transistor $M_6$ can conduct, the voltage at its source terminal has to still be above the supply voltage $U_{VDD}$ by the threshold voltage $U_{THP}$ of a PMOS transistor. This is the case in the circuit according to FIG. 2 when $U_{TEST} \geq 2 \times (U_{VDD}+U_{THP})$. If $U_{TEST}$ is smaller, then $M_6$ blocks, and the input of Schmitt trigger $SMT_2$ is connected to GND by $R_6$. Accordingly, the counter is incremented upward with each voltage pulse whose amplitude is greater than $2 \times (U_{VDD}+U_{THP})$.

Transistors $M_5$ and $M_9$ are used to protect Schmitt triggers $SMT_1$ and $SMT_2$. They limit the input voltage in each case to a maximum of $U_{VDD}-U_{THN}$, where $U_{THN}$ is the threshold voltage of an NMOS transistor. The resistor $R_5$ and the transistors $M_7$ and $M_8$, on the other hand, limit the source gate voltage of $M_6$. If the voltage at ASIC terminal TEST is large enough that the drain body diode of $M_7$ conducts and a channel can form in $M_8$, then the gate potential of $M_6$ is increased, so that the source gate voltage of $M_6$ cannot become substantially greater than the sum of the threshold voltage of a PMOS transistor and the flux voltage of a drain body diode.

The exemplary embodiment according to FIG. 2 is limited to three analog signals $A_1, A_2, A_3$. However, in generaly, any desired number of analog signals is observable through the addition of further transmission gates, D flipflops, and through the expansion of the 1-of-m decoder. Accordingly, if more than three internal analog signals are to be observable, then the 1-of-m decoder has to be expanded as stated above.

Correspondingly, given more than three analog signals and more than two D flipflops, the non-inverting outputs of the further D flipflops are to be connected to additional inputs of the OR gate, and the inverted outputs of the additional D flipflops are to be connected to additional inputs of the AND gate.

FIG. 3 shows an exemplary embodiment of an electrical circuit for testing digital and analog signals, with the possibility of activating different test modes, in which the circuit shown in FIG. 2 has been correspondingly expanded. Through such a circuit it becomes possible, via the ASIC terminal TEST, to activate different test modes in addition to the testability of internal digital and analog signals.

It is to be noted that the approaches shown in FIG. 2, in which response thresholds having different levels are created for a plurality of Schmitt triggers, could be further pursued. However, because the internal supply voltage $U_{VDD}$ can also change (in particular can become lower) during the test, the voltage $U_{TEST}$ at the ASIC terminal TEST would then have to be entrained ratiometrically to the internal supply voltage $U_{VDD}$, which sometimes may not be possible because the internal supply voltage may not be measurable via a separate ASIC terminal.

It may therefore be advantageous to use, in addition to the Schmitt trigger $SMT_1$ used to activate the test mode, an additional Schmitt trigger having a very high response threshold, so that even a significant reduction in the internal supply voltage $U_{VDD}$ cannot have the result that this Schmitt trigger switches undesirably when there is a voltage $U_{TEST}$ that remains constant at ASIC terminal TEST and a strongly reduced internal supply voltage $U_{VDD}$. The use of a plurality of Schmitt triggers having very high response thresholds is nonetheless possible, but sometimes demands a very high voltage strength of the components that are internally connected to the ASIC terminal TEST in the ASIC.

In the circuit shown in FIG. 3, therefore, in addition to Schmitt trigger $SMT_1$ for activating the test mode, a further Schmitt trigger $SMT_2$ having a very high response threshold is used. This circuit also realizes, as an example, the testability of three digital signals $D_1$ through $D_3$ and three analog signals $A_1$ through $A_3$. In addition, four different test modes can be activated.

The output of the Schmitt trigger $SMT_2$ changes from LOW to HIGH when its input voltage increases above the switching threshold of, typically, $2/3 \times U_{VDD}$. It changes from HIGH to LOW when its input voltage decreases below the switching threshold of, typically, $1/3 \times U_{VDD}$. The input of the Schmitt trigger $SMT_2$ is connected to the ASIC test pin TEST via the transistors $M_6$ and $M_9$ and the voltage divider made up of $R_7$ through $R_9$, where $R_7=2R/3$ and $R_8=R/12$ and R9=R/4. For transistor $M_6$ to be able to conduct, the voltage at its source terminal must be greater than the supply voltage $U_{VDD}$ by the threshold voltage $U_{THP}$ of a PMOS transistor. This is the case in the circuit according to FIG. 3 when $U_{TEST} \geq 3 \times (U_{VDD}+U_{THP})$. If $U_{TEST}$ is smaller, then $M_6$ blocks, and the input of Schmitt trigger $SMT_2$ is connected to GND by $R_6$. When TM=LOW, all D flipflops $FF_1$ through $FF_6$ are set to Q=LOW, because the HIGH level of the inverter $X_9$ resets the D flipflops $FF_1$ through $FF_6$ via their CLR (clear) inputs (the outputs Q of the D flipflops are then LOW).

If the output of the D flipflop (network EN CMP) is LOW, then the comparators $CMP_1$ and $CMP_2$ are deactivated. The outputs of the comparators used here are then LOW. If the output of the D flipflop is HIGH, then the comparators $CMP_1$ and $CMP_2$ are activated. Using the comparators $CMP_1$ and $CMP_2$, through variation of the voltage at ASIC test pin TEST on the one hand it is possible to select whether the digital signals $D_1$ through $D_3$ or one of the analog signals $A_1$ through $A_3$ are to be acquired by measurement via the ASIC terminal TEST. On the other hand, it is possible to activate different test modes. Based on the possibility of deactivating the comparators $CMP_1$ and $CMP_2$, the internal signals $D_1$ through $D_3$ or $A_1$ through $A_3$ can also be tested if the operating voltage $U_{VDD}$ or the reference voltage $U_{VREF}$ have not assumed their target values. In this way, for example via the ASIC terminal TEST, the internal supply voltage $U_{VDD}$ starting from which the internal reference voltage $U_{VREF}$ reaches its target value, or an internal power-on-reset signal changes its state, can be acquired by measurement without there being the risk that one of the comparators $CMP_1$ and $CMP_2$ could undesirably switch.

The activated comparators $CMP_1$ and $CMP_2$ supply HIGH levels when the voltage at their respective negative input is smaller than the reference voltage $U_{VREF}$. The resistors $R_{10}$ and $R_{11}$, and the capacitors $C_1$ and $C_2$, act as filters and delay elements. The transistors $M_{10}$ and $M_{11}$ protect the comparator inputs from excessively high voltages at their inputs by limiting them to a maximum of $U_{VDD}$-$U_{THN}$ where $U_{THN}$ is the threshold voltage of an NMOS transistor. Taking into account the voltage divider made up of resistors $R_7$ through $R_9$, the comparator outputs of $CMP_1$ or $CMP_2$ are correspondingly at HIGH, given a voltage $U_{TEST}>3 \times U_{VREF}$ or, respectively, $U_{TEST}>4 \times U_{VREF}$; otherwise the respective comparator output is at LOW.

In the exemplary embodiments according to FIG. 2 and FIG. 3, both the flipflops $FF_1$ and $FF_2$ and the flipflops $FF_4$, $FF_5$, and $FF_6$ are reset. The flipflops $FF_1$ and $FF_2$ here either select all digital signals simultaneously (counter state 00) or one of the analog signals (counter state 01, 10, 11). The flipflops $FF_5$ and $FF_6$, in contrast, are provided for the selection of a test mode.

In FIG. 4, the signal curve is shown for the above-named exemplary embodiment of an electrical circuit for testing digital and analog signals, with the possibility of activating different test modes; here, for the representation of the time signal curves, as an example a supply voltage of $U_{VDD}$=5 V and a reference voltage of $U_{VREF}$=1V are assumed, and times 1 through 7 are identified with circled numerals.

As is shown in FIG. 4, in part higher voltages occur at the test pin than can be processed by the following Schmitt trigger, for example up to 20 V. The circuit formed from components $M_6$, $M_7$, $M_6$, $M_9$, $R_5$, and $R_6$, shown in FIG. 2, protects the input of Schmitt trigger $SMT_2$ from these high voltages.

At time 1, the voltage $U_{TEST}$ changes its value from 0 V to 5 V. Correspondingly, the output of Schmitt trigger $SMT_1$ is at HIGH, and the output of inverter $X_9$ is at LOW (CLR_FF=LOW).

At time 2, the voltage $U_{TEST}$ briefly changes its value from 5 V to 20 V (and subsequently back to 5 V). Correspondingly, the output of Schmitt trigger $SMT_2$ is (briefly) HIGH, and the level of D flipflop $FF_3$ changes from LOW to HIGH. Comparators $CMP_1$ and $CMP_2$ are thereby activated.

At time 3, voltage $U_{TEST}$ changes its value from 5 V to 2.5 V. Correspondingly, the output of comparator $CMP_2$ changes, with a time delay, from LOW to HIGH (CMPB=HIGH), and the output of comparator $CMP_1$ also changes, with a time delay relative to $CMP_2$, from LOW to HIGH (CMPA=HIGH). Correspondingly, the output of D flipflop $FF4$ changes from LOW to HIGH (CMPA_Q=HIGH), and the output of OR gate $X_15$ changes from LOW to HIGH (CMPB_H=HIGH).

At time 4, the voltage $U_{TEST}$ changes its value from 2.5 V to 5 V. Correspondingly, the output of comparator $CMP_1$ changes, with a time delay, from HIGH to LOW (CMPA=LOW), and the output of comparator $CMP_2$ also changes, with a time delay relative to $CMP_1$, from HIGH to LOW (CMPB=LOW). On the basis of the delay element, made up of transistors $M_{12}$ and $M_{13}$, resistor $R_{12}$, and capacitor $C_3$, the output of OR gate $X_{15}$ changes, with a time delay relative to that of comparator $CMP_2$, from HIGH to LOW (CMPB_H=LOW). At CMPB_H=LOW, the output of OR gate $X_{12}$ is set to HIGH, and that of D flipflop $FF_4$ is set to LOW, because the HIGH signal of $X_{12}$ is at its CLR (clear) input. While CMPB is already LOW and CMPB_H is still HIGH, the output of AND gate $X_{13}$ is briefly HIGH (CMPB_P briefly HIGH). Because the output of D flipflop $FF_4$ was set to HIGH at time 3, at the output of AND gate $X_{11}$ there likewise occurs a short HIGH pulse that increments upward the counter made up of D flipflops $FF_5$ and $FF_6$, thus changing over from test mode 00 to test mode 01. The corresponding output signals $MD_0$ and $MD_1$ can be used in the ASIC to create particular test conditions. On the basis of the counter, made up in the present case of D flipflops $FF_5$ and $FF_6$, which is also shown in FIG. 3, a shift register could also be used to set a test mode, where the difference between a 0 and a 1 could be realized using short and long pulses.

At time 5, the voltage $U_{TEST}$ changes its value from 5 V to 3.5 V. Correspondingly, (only) the output of comparator $CMP_2$ changes, with a time delay, from LOW to HIGH (CMPB=HIGH). Correspondingly, the output of OR gate $X_{15}$ changes from LOW to HIGH (CMPB_H=HIGH).

At time 6, voltage $U_{TEST}$ changes its value from 3.5 V to 5 V. Correspondingly, the output of comparator $CMP_2$ changes, with a time delay, from HIGH to LOW (CMPB=LOW). Due to the delay element ($M_{12}$, $M_{13}$, $R_{12}$, $C_3$), the output of OR gate $X_{15}$ changes, with a time delay relative to that of comparator $CMP_2$, from HIGH to LOW (CMPB_H=LOW). While CMPB is already LOW and CMPB_H is still HIGH, the output of AND gate $X_{13}$ is briefly HIGH (CMPB_P briefly HIGH). Because the output of D flipflop $FF_4$ was set to LOW at time 4, at the output of AND gate $X_{10}$ there also arises a brief HIGH pulse that increments the counter, made up of D flipflops $FF_1$ and $FF_2$, upward from 00 to 01, and thus, as described correspondingly for FIG. 2, switches the analog signal $A_1$ to the operational amplifier $OP_1$ via the transmission gate $TG_2$, so that this amplifier becomes capable of being acquired by measurement via the ASIC test pin TEST.

At time 7, the voltage $U_{TEST}$ briefly changes its value from 5 V to 20 V (and subsequently back to 5 V). Correspondingly, the output of Schmitt trigger $SMT_2$ is (briefly) HIGH, and that of D flipflop $FF_3$ changes from HIGH to LOW. Comparators $CMP_1$ and $CMP_2$ are thereby deactivated. Now, for example via the ASIC terminal TEST, the internal supply voltage $U_{VDD}$ starting from which the internal reference voltage $U_{VREF}$ reaches its target value, or an internal power-on-reset signal changes its state, can be acquired by measurement without there being a risk that one of the comparators could switch undesirably.

In the further time period after time 7, in FIG. 4 it is shown that a change of the voltage $U_{TEST}$ from 5 V to 2.5 V no longer has any influence on comparators $CMP_1$ and $CMP_2$, and thus also no longer has any influence on the state of the D flipflops. If the voltage $U_{TEST}$ is set to 0 V, then the test mode is exited, and all D flipflops are reset.

What is claimed is:

1. An electrical circuit for testing primary internal signals of an application-specific integrated circuit (ASIC), only one test pin being provided via which a selection can be carried out of digital signals or of an analog signal to be observed, the electrical circuit comprising:
   a Schmitt trigger situated between the test pin and an output terminal of the electrical circuit, an activation of a test mode being provided when a switching threshold of the Schmitt trigger is exceeded; and
   at least one sub-circuit configured for observing a digital signal, each of the at least one sub-circuit including a resistor, an NMOS transistor, and an AND gate, wherein at a first input of the AND gate, the digital signal is present, the resistor being situated between the test pin and a drain terminal of the NMOS transistor, a source terminal of the NMOS transistor being connected to ground, a gate terminal of the NMOS transistor being connected to an output of the AND gate, and a second input of the AND gate being connected to the output terminal of the electrical circuit.

2. The electrical circuit as recited in claim 1, wherein a current measurable at the test pin is determinable based on states of all the digital signals or of a selected analog signal, and the state of all digital signals or the state of the selected analog signal being inferable using the measurable current.

3. The electrical circuit as recited in claim 1, further comprising:
   a further resistor situated between the test pin and ground.

4. The electrical circuit as recited in claim 3, wherein the electrical circuit includes n of the sub-circuits for n of the digital signals, the resistors of the n circuits are provided that are dimensioned corresponding to a calculation $R_0=2^0 \times R$, $R_1=2^1 \times R$, $R_2=2^2 \times R, \ldots, R_n=2^n \times R$, wherein $R_0$ is the further resistor, $R_1$ is the resistor for a first one of the sub-circuits, $R_2$ is the resistor for a second one of the sub-circuits, and $R_n$ is the resistor for the nth one of the sub-circuits.

5. The electrical circuit as recited in claim 1, wherein the electrical circuit is also configured for observation analog signals, the electrical circuit further comprising:
   an operational amplifier;
   a circuit having a further Schmitt trigger configured to limit an input voltage at the test pin; and
   at least one sub-circuit provided for observing the analog signal.

6. The electrical circuit as recited in claim 5, wherein the sub-circuit provided for observing the analog signal includes:
   a counter having at least two D flipflops; and
   for each analog signal to be observed, a respective decoder having a respective AND gate and a respective transmission gate.

7. The electrical circuit as recited in claim 6, wherein a first input of the respective AND gate is connected to a non-inverting output or to an inverting output of a first of the at least two D flipflops, a second input of the respective AND gate is connected to a non-inverting output or to an inverting output of a second of the at least two D flipflops, and an output of the respective AND gate is connected to an input or controlling the respective transmission gate.

8. The electrical circuit as recited in claim 7, further comprising:
   an OR gate, a first input of the OR gate being connected to the non-inverting output of the first of the at least two D flipflops, a second input of the OR gate is connected to the non-inverting output of the second of the at least two D flipflops, and an output of the OR gate is connected to an input for controlling the operational amplifier.

9. The electrical circuit as recited in claim 7, further comprising:
   a further AND gate, a first input of the further AND gate is connected to the inverting output of the first of the at least two D flipflops, a second input of the further AND gate is connected to the inverting output of the second of the at least two D flipflops, a third input of the further AND gate is connected to an output of the Schmitt trigger, and an output of the further AND gate is connected to a third input of the respective AND gate which is situated in the sub-circuit configured for observing a digital signal.

10. The electrical circuit as recited in claim 5, wherein an input of the circuit having the further Schmitt trigger for limiting the input voltage at the test pin is situated between two resistors of a voltage divider situated between the test pin of the electrical circuit and ground, and an output of the circuit is connected to a clock signal input of a D flipflop.

11. The electrical circuit as recited in claim 5, wherein the output terminal of the electrical circuit is inverted by an inverter, and is connected to a clear input of a D flipflop.

12. The electrical circuit as recited in claim 5, further comprising:
    two comparators for selecting the digital or analog signals to be measured via the test pin, and for activating different test modes.

13. The electrical circuit as recited in claim 12, wherein a reference voltage is present at a positive input of each of the comparators, and a negative input of each of the comparators is connected to the test pin.

14. The electrical circuit as recited in claim 13, wherein a further circuit, made up of a transistor and a resistor and a capacitor, is provided between the negative input of each of the comparators and the test pin of the electrical circuit.

15. The electrical circuit as recited in claim 12, further comprising:
    a D flipflop having a clock signal input connected to the output of the further Schmitt trigger and having a non-inverting output is connected to an input for controlling one of the comparators.

16. The electrical circuit as recited in claim 5, further comprising:
    two D flipflops for provision of output signals.

17. The electrical circuit as recited in claim 5, further comprising:
    a shift register made up of D flipflops for selecting signals to be tested and for setting a test mode.

* * * * *